United States Patent
Wang et al.

(10) Patent No.: US 6,736,927 B2
(45) Date of Patent: May 18, 2004

(54) APPARATUS FOR INCREASED WORKPIECE THROUGHPUT

(75) Inventors: Albert Wang, Moraga, CA (US); Scott Baron, Menlo Park, CA (US); Prasad Padmanabhan, San Francisco, CA (US); Gerald M. Cox, Lafayette, CA (US)

(73) Assignee: Matrix Integrated Systems, Inc., Richmond, CA (US)

( * ) Notice: Subject to any disclaimer, the term of this patent is extended or adjusted under 35 U.S.C. 154(b) by 0 days.

(21) Appl. No.: 10/167,937

(22) Filed: Jun. 10, 2002

(65) Prior Publication Data

US 2002/0153099 A1 Oct. 24, 2002

Related U.S. Application Data

(62) Division of application No. 09/749,648, filed on Dec. 27, 2000, now Pat. No. 6,409,932.
(60) Provisional application No. 60/194,227, filed on Apr. 3, 2000.

(51) Int. Cl.[7] .................................................. H01J 1/13
(52) U.S. Cl. ............................ 156/345.27; 156/345.52; 156/345.54; 34/402; 313/552; 315/94; 315/108; 315/111.21; 315/112; 432/24; 432/121; 432/205
(58) Field of Search .......................... 34/402, 403, 404, 34/406; 205/209; 313/552; 432/24, 121, 198, 200, 205; 156/354.5; 315/94, 108, 111.2; 216/55

(56) References Cited

U.S. PATENT DOCUMENTS

| | | | |
|---|---|---|---|
| 4,861,424 A | 8/1989 | Fujimura et al. | |
| 5,965,034 A | 10/1999 | Vinogradov et al. | |
| 5,968,374 A | 10/1999 | Bullock | |
| 6,352,936 B1 | 3/2002 | Jehoul et al. | |
| 2002/0151156 A1 | 10/2002 | Hallock et al. | |

*Primary Examiner*—Allan W. Olsen
(74) *Attorney, Agent, or Firm*—Knobbe, Martens, Olson & Bear LLP

(57) ABSTRACT

A system is disclosed for speeding workpiece thoughput in low pressure, high temperature semiconductor processing reactor. The system includes apparatus for loading a workpiece into a chamber at atmospheric pressure, bringing the chamber down to an intermediate pressure, and heating the wafer while under the intermediate pressure. The chamber is then pumped down to the operating pressure. The preferred embodiments involve single wafer plasma ashers, where a wafer is loaded onto lift pins at a position above a wafer chuck, the pressure is rapidly pumped down to about 40 Torr by rapidly opening and closing an isolation valve, and the wafer is simultaneously lowered to the heated chuck. Alternatively, the wafer can be pre-processed to remove an implanted photoresist crust at a first temperature and the chamber then backfilled to about 40 Torr for further heating to close to the chuck temperature. At 40 Torr, the heat transfer from the chuck to the wafer is relatively fast, but still slow enough to avoid thermal shock. In the interim, the pump line is further pumped down to operating pressure (about 1 Torr) behind the isolation valve. The chamber pressure is then again reduced by opening the isolation valve, and the wafer is processed.

18 Claims, 8 Drawing Sheets

APPARATUS FOR INCREASED WORKPIECE THROUGHPUT

REFERENCE TO RELATED APPLICATION

The present application is a divisional of U.S. application Ser. No. 09/749,648, filed Dec. 27, 2000 now U.S. Pat. No. 6,409,932, which claims the priority benefit under 35 U.S.C. §119(e) to provisional application No. 60/194,227, filed Apr. 3, 2000.

FIELD OF THE INVENTION

The present invention relates generally to equipment and methods of operating equipment for semiconductor fabrication. More particularly, the invention relates to methods of improving throughput in temperature ramping.

BACKGROUND OF THE INVENTION

Photoresist removal (stripping or ashing) is one of the most frequently applied processes in semiconductor industry. Due to the number of photolithographic mask steps in most fabrication process flows, it is important that ashers (strippers) attain high throughput. Removing photoresist in a vacuum chamber using an aggressive plasma chemistry is considered to be the industry standard.

Two types of system architectures for plasma ashers are widely adopted. A first architecture employs a vacuum load-lock and a wafer vacuum transfer chamber, all kept at vacuum during processing of one cassette of wafers or other workpieces. A cassette of wafers is placed in the load-lock and the load-lock is then evacuated with a vacuum pump. A wafer transfer robot then transfers the wafers from the load-lock through the transfer chamber to a process chamber where plasma is generated to remove (strip or ash) the photoresist. In the normal operating mode, the load-lock, the wafer transfer chamber and the process chamber are all constantly under vacuum. After an entire cassette of wafers is processed and transferred back to the load-lock, the cassette load-lock is then vented to atmosphere, the processed wafers are removed and a new cassette of wafers is loaded.

A second system architecture transfers wafers from the cassette in an atmosphere-to-vacuum-to-atmosphere (AVA) sequence for each individual wafer. The robot and the wafer cassette are always at atmospheric pressure. The robot transfer wafers from the wafer cassette to the process chamber. A vacuum pump then evacuates the process chamber to a certain vacuum level suitable for plasma formation. The plasma source then generates plasma to remove photoresist. After the process is complete, the process chamber is vented to atmosphere and the processed wafer is transferred back into the cassette. This architecture entails pumping down the process chamber and venting back to atmospheric pressure for each individual wafer.

The first architecture employs two additional vacuum chambers (the load lock and transfer chambers), generally requiring an additional vacuum pump to pump down two chambers, and therefore is much more expensive than the second architecture. Machines using the first architecture are usually larger and occupy more clean room floor space, which is considered to be premium commodity in a semiconductor fabrication factory. Advantageously, however, the vacuum load-lock systems of the first architecture have relatively low non-productive overhead, exhibiting high throughput.

On the other hand, the second technique (atmospheric-to-vacuum-to-atmospheric, or AVA) involves a lower initial capital expenditure and occupies less space on the clean room floor. In order to compensate for relatively higher non-productive overhead than the vacuum load-lock system, a variety of improvements have been made to the AVA system. A conventional wafer processing sequence of the AVA machine architecture is as follows:

1. The robot transfers a new wafer or other workpiece from the cassette to the process chamber and places the wafer on support pins.
2. The wafer is lowered onto a high temperature chuck (platen).
3. The chuck heats the wafer up to the desired process temperature (e.g. 250° C.).
4. The chamber is then pumped down to a desired process or treatment pressure (e.g. 1 Torr).
5. The process gases start to flow and plasma is ignited by a plasma source.
6. After the photoresist has been removed, the chamber is then vented back to atmospheric pressure (760 Torr).
7. The robot then exchanges the processed wafer for a fresh one from the cassette while transferring the processed wafer back to the cassette.

All the above steps are highly optimized to reduce the time required to complete each step. Heat transfer between the chuck and the wafer occurs most efficiently at atmospheric pressure; therefore, wafers are usually heated up before pumping down the chamber. In one commercial system, it takes about four seconds to heat a wafer from 20° C. to 250° C. at atmospheric pressure. In contrast, at a low pressure (1 Torr), it takes about 60°seconds.

Rapid wafer heating at atmospheric pressure sometimes causes wafer warping, however, which can have a variety of negative effects. Wafer warping may damage the circuits that are already fabricated on the wafer. If a wafer is warped on a chuck, the wafer temperature is no longer evenly distributed. A non-uniform wafer temperature distribution results in a highly non-uniform process, since temperature is a very sensitive process variable. The wafer is usually transferred into the chamber at room temperature (20° C.). Once inside the chamber, the wafer starts to warm up somewhat while suspended above the chuck (e.g, on lift pins). To reduce the degree of thermal shock on the wafer, and consequently prevent wafer warping, the wafer can be left suspended over the chuck for a few seconds to pre-heat the wafer before lowering the wafer onto the high temperature chuck. The wafer descent rate can also be slowed so that the wafer is warming up on its way to the chuck. Both of these options, however, also reduce throughput.

Other efforts to improve throughput focus on minimizing the time to pump the chamber down to the treatment pressure (typically 1 Torr). Conventionally, a large vacuum pump is used for a high-speed pumping. A large diameter vacuum line is used to increase the pump line conductance. Moreover, a dedicated roughing line, described in more detail in the Detailed Description of the preferred embodiments, is introduced to bypass the high resistance throttle valve and further increase the overall pump speed during pump down. A dedicated roughing line is beneficial because the throttle valve can stay at its previous throttling position, dramatically reducing the time to reach a stable treatment pressure. Without the dedicated roughing line, the throttle valve has to be wide open during pump-down to reduce the pump-down time and then rotate to its throttling position when the process gases start to flow. This can take as much as an additional five seconds to stabilize the pressure after the chamber is pumped down.

Despite incremental improvements to the speed of each sequential step in the ashing process, a need exists for further improvements to throughput for plasma asher systems.

SUMMARY OF THE INVENTION

A method is disclosed for speeding workpiece thoughput in low pressure, high temperature semiconductor processing reactor. The method includes loading a workpiece into a chamber at atmospheric pressure, bringing the chamber down to an intermediate pressure, and heating the wafer while under the intermediate pressure. The chamber is then pumped down to the operating pressure at which substrate treatment is conducted.

The preferred embodiments involve single wafer plasma ashers, where a wafer is loaded onto lift pins at a position above a wafer chuck. After placement and sealing the chamber the pressure is rapidly pumped down from a load/unload pressure (preferably atmospheric) to about 40 Torr by rapidly opening and closing an isolation valve, and the wafer is simultaneously lowered to the heated chuck. At 40 Torr, the heat transfer from the chuck to the wafer is relatively fast, but still slow enough to avoid thermal shock. In the interim, the pump line is further pumped down to operating pressure (about 1 Torr) behind the isolation valve. The chamber pressure is then again reduced by opening the isolation valve, and the wafer is processed.

It will be understood, of course, that the preferred embodiments are merely exemplary and that other intermediate pressures can be selected, in view of the disclosure herein, depending upon the system and treatment process involved.

DETAILED DESCRIPTION OF THE PREFERRED EMBODIMENTS

While illustrated in the context of a single wafer, remote plasma system, the skilled artisan will readily find application for the principles disclosed herein to a variety of systems in which rapid heating of a workpiece and rapid pump-down of the a chamber are desired. The invention has particular, though not exclusive, utility for plasma ashers.

Figure 1:
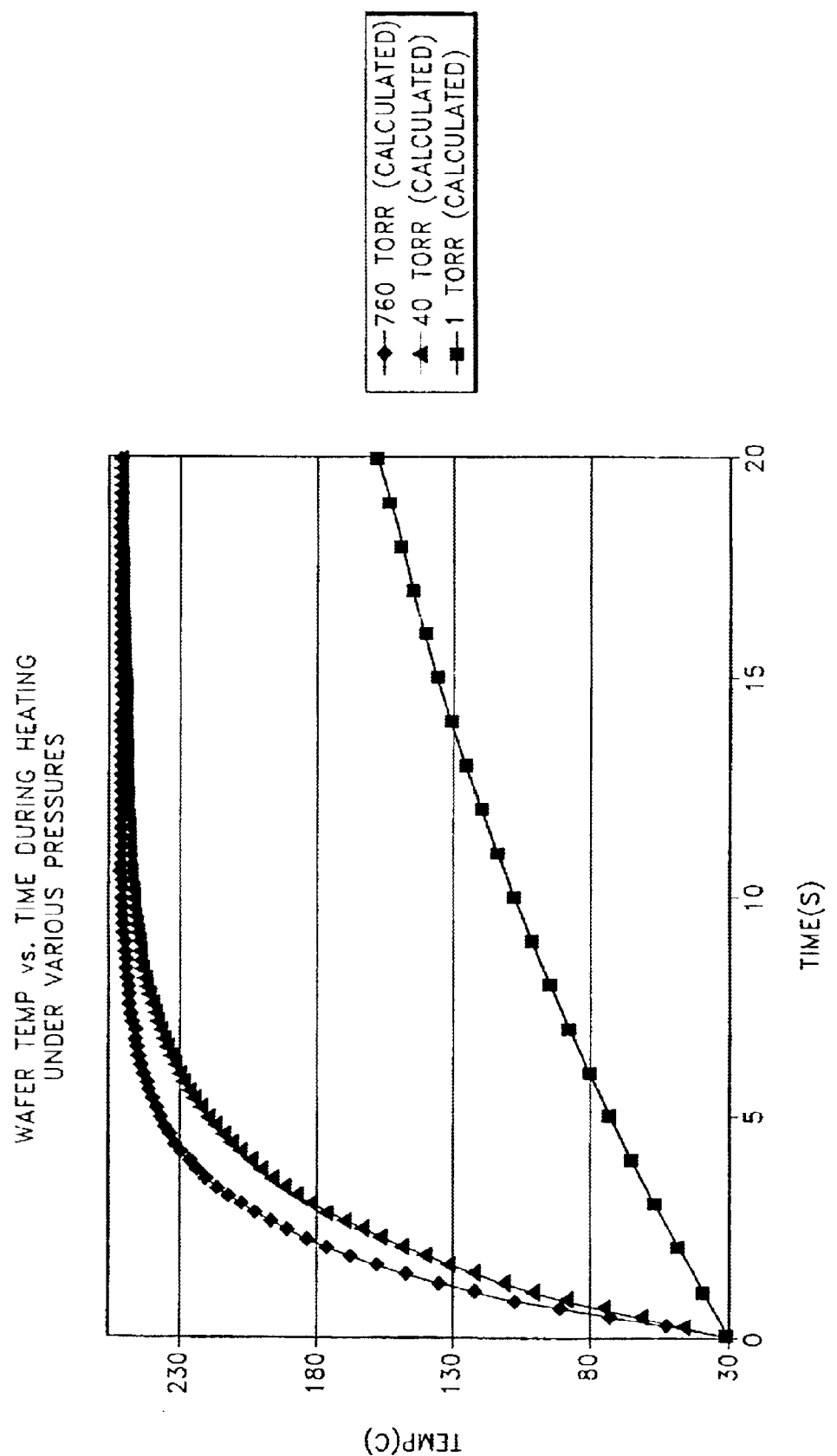
FIG. 1 is a temperature vs. time graph, illustrating wafer temperature ramping at various pressures.

Referring initially to FIG. 1, wafer-heating characteristics were studied at various pressure levels and it was found that the rate of heat transfer could be controlled with pressure.

FIG. 1 shows three wafer heating curves at atmospheric pressure, at an intermediate pressure and at an operating pressure. In the illustrated examples, these pressures are 760 Torr, 40 Torr and 1 Torr, respectively. All three curves asymptotically approach 250° C. The 1 Torr curve shows a very slow heat transfer rate. The 40 Torr curve has a slightly slower heat transfer rate than the 760 Torr, but lags only about 2 to 3 seconds behind the 760 Torr curve. With the chuck maintained at 250° C., the wafer temperature is approximately 245° C. at steady state when the stripping (ashing) process starts.

Figure 2A:
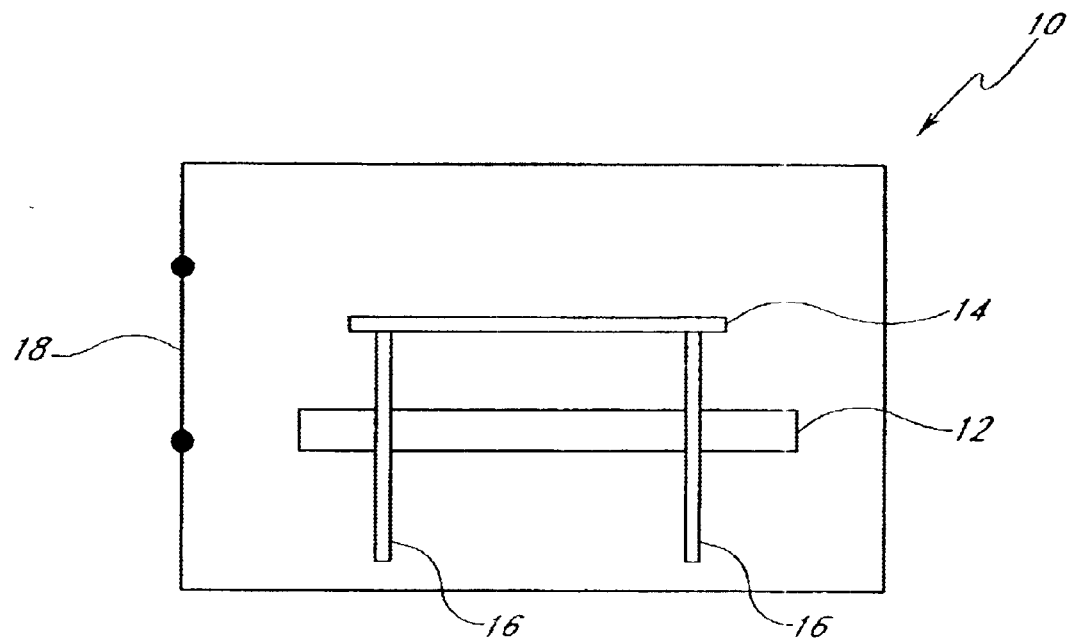
FIGS. 2A and 2B are schematic diagrams of a process chamber in accordance with the preferred embodiments, including a wafer chuck with lift pins.
Figure 2B:
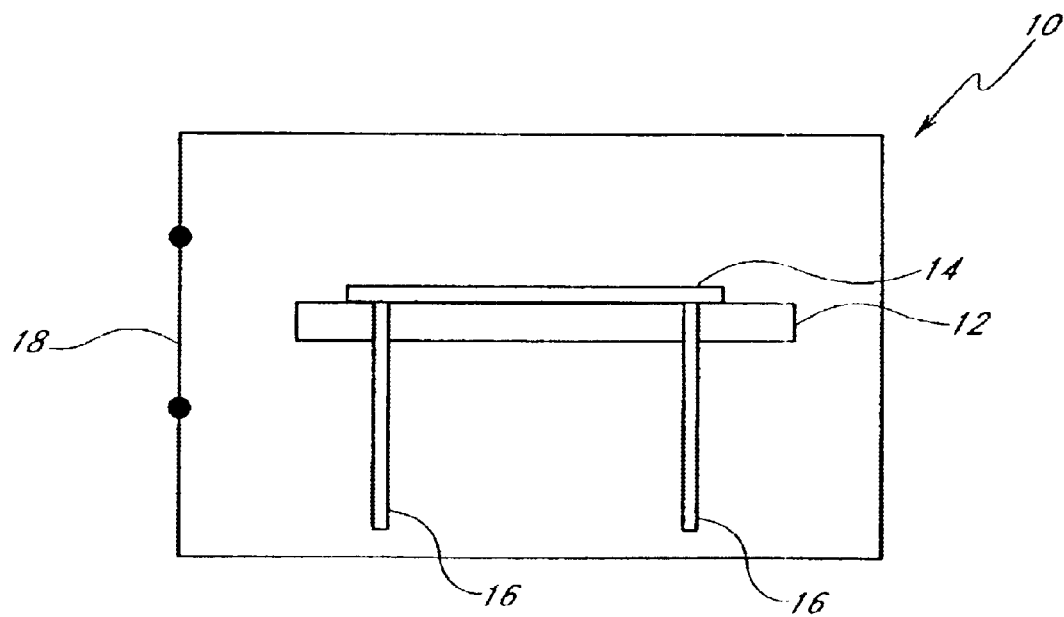

FIGS. 2A and 2B show a process chamber 10 in accordance with the preferred embodiments. In the illustrated embodiments, a wafer support structure or chuck 12 is heated (e.g, by hot fluid circulated therethrough or by resistance heating) to a process temperature and maintained at that temperature during the sequential processes described below. Preferably, the temperature is greater than about 150° C., more preferably between about 200° C. and 300° C., and most preferably between about 225° C. and 250° C. in the illustrated plasma asher context.

FIG. 2A shows a wafer 12 or other workpiece in an upper position, spaced but proximate the heated wafer chuck 14. In the illustrated embodiment, the wafer 14 is held in the upper position by lift pins 16 that extend through the wafer chuck 14, although the skilled artisan will readily appreciate that the wafer can by held by a pick-up device or other mechanism in the upper position. The wafer 14 is generally loaded into the chamber 10 through a gate valve 18 and supported at the upper position prior to processing, and is also unloaded from the upper position.

The preferred system of which the chamber 10 forms a part of an atmospheric-to-vacuum-to-atmospheric (AVA) system, with attendant low capital costs. However, the principles and advantages disclosed herein will also have utility in other contexts. For example, many cluster tools will have a lowered pressure for the load lock and transfer chamber, and an even lower operating pressure. For such systems, the load/unload pressure may not be atmospheric, but will be higher than the operating pressure for the treatment performed within the process chamber 10. The chamber 10 is also in fluid communication with a remote plasma unit (not shown), though the skilled artisan will appreciate that in situ plasma processors are also envisioned.

FIG. 2B shows the wafer 14 after being lowered to the wafer chuck 12. In the illustrated embodiment, the wafer 14 is lowered by withdrawing the lift pins 16, though in other arrangements a pick-up device or other extraneous mechanism can lower the wafer to the chuck. In the illustrated embodiment, the wafer 14 is maintained on the chuck 12 by gravitation, unaided by vacuum, electrostatic or clamping forces. Accordingly, wafer curl is of greater concern.

Figure 3:
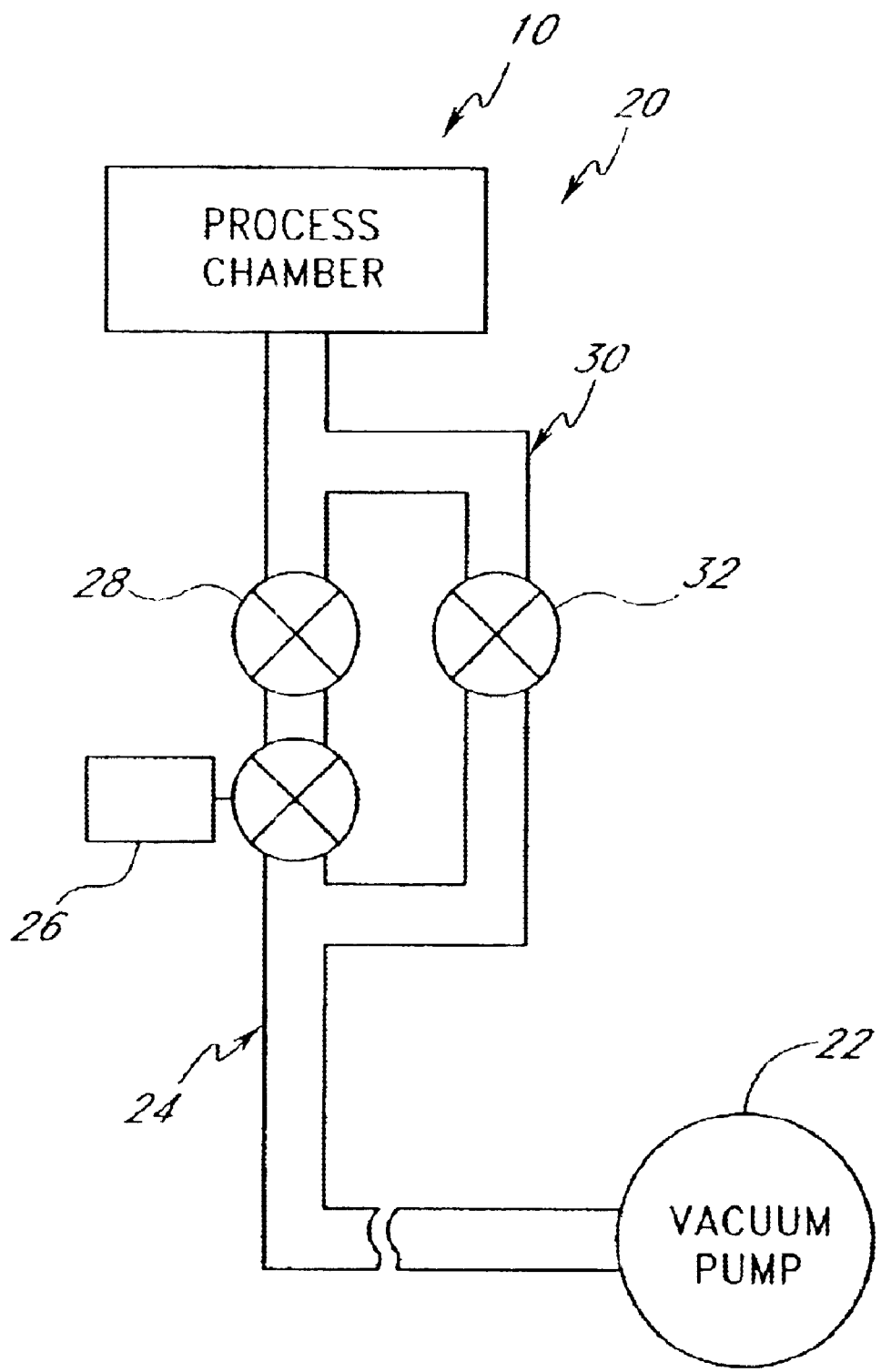
FIG. 3 is a schematic diagram of a vacuum pumping system in accordance with one embodiment of the invention.

FIG. 3 shows a high conductance vacuum system 20 in accordance with one embodiment of the present invention. The system 20 includes a high speed vacuum pump 22. An exemplary pump is the commercially available Edwards 80/1200 pump, which has a maximum pumping speed of 554 cubic feet per minute (CFM). The chamber 10 of the illustrated embodiments had a volume of about 8 liters. Vacuum or pump lines 24 between the pump and the chamber 10 have a length of about 20 meters and a diameter of about 100 mm. The volume of the pump lines 24 is significantly larger than that of the chamber 10 so that it draws the chamber pressure down to the intermediate pressure of the pump lines 24 quickly. Preferably, the pump lines 24 have a volume more than five times larger than the process chamber 10, more preferably more than ten times greater, and in the illustrated example the pump lines 24 are almost 20 times greater than the process chamber.

In accordance with the illustrated embodiment, the system 20 includes a throttle valve 26 and a throttling isolation valve 28. Additionally, a parallel roughing line 30, forming part of the pump lines 24, includes a roughing isolation valve 32. The operation of the throttle and isolation valves 26, 28, 32 is described below.

Figure 4:
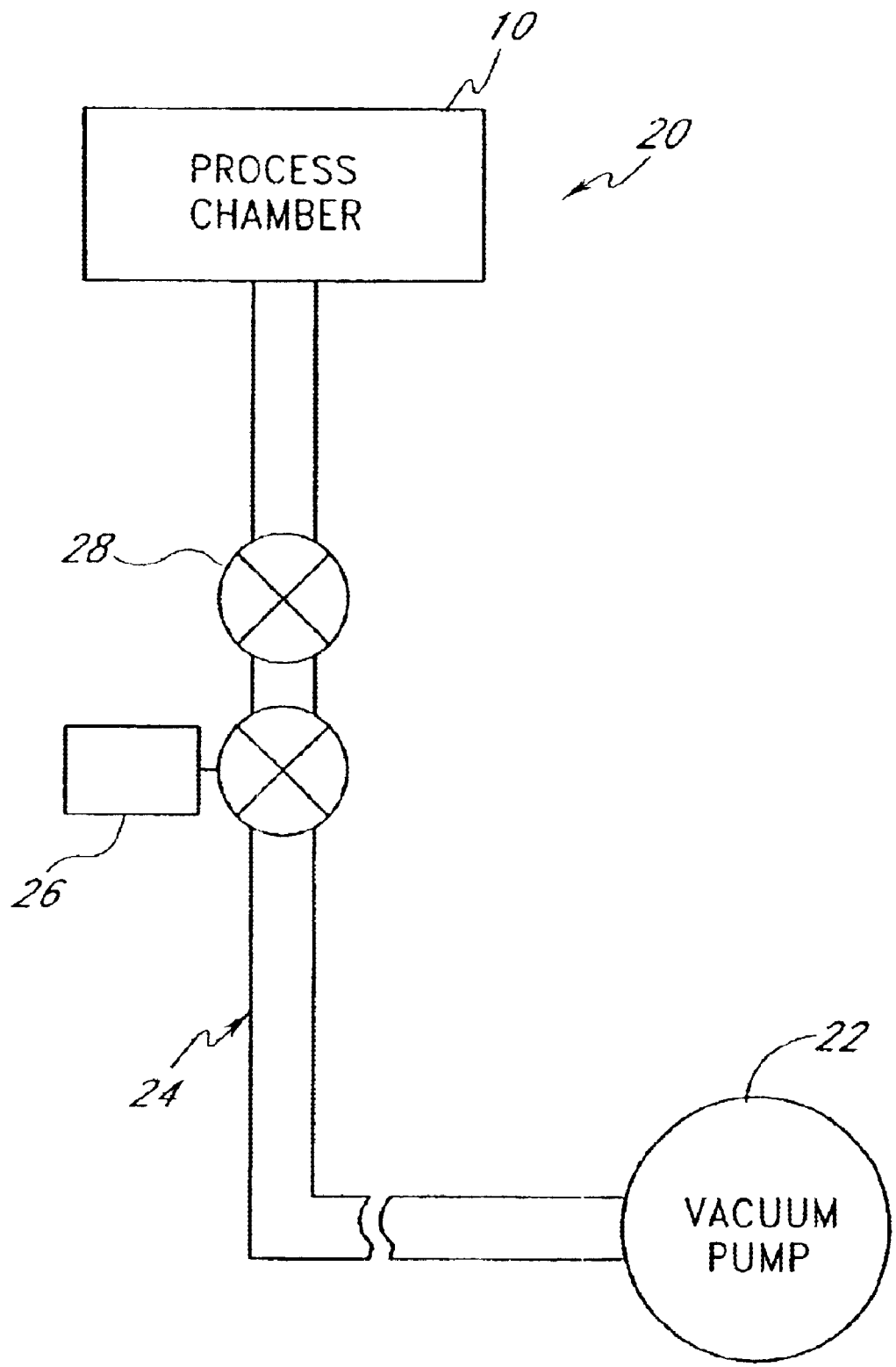
FIG. 4 is a schematic diagram of a vacuum pumping system in accordance with another embodiment of the invention.

FIG. 4 shows a vacuum system 20 in accordance with another embodiment of the present invention. In accordance with this embodiment, the roughing line and attendant roughing isolation valve are omitted. The remaining features are similar to those of FIG. 3 and are accordingly indicated by like reference numerals.

Figure 5A:
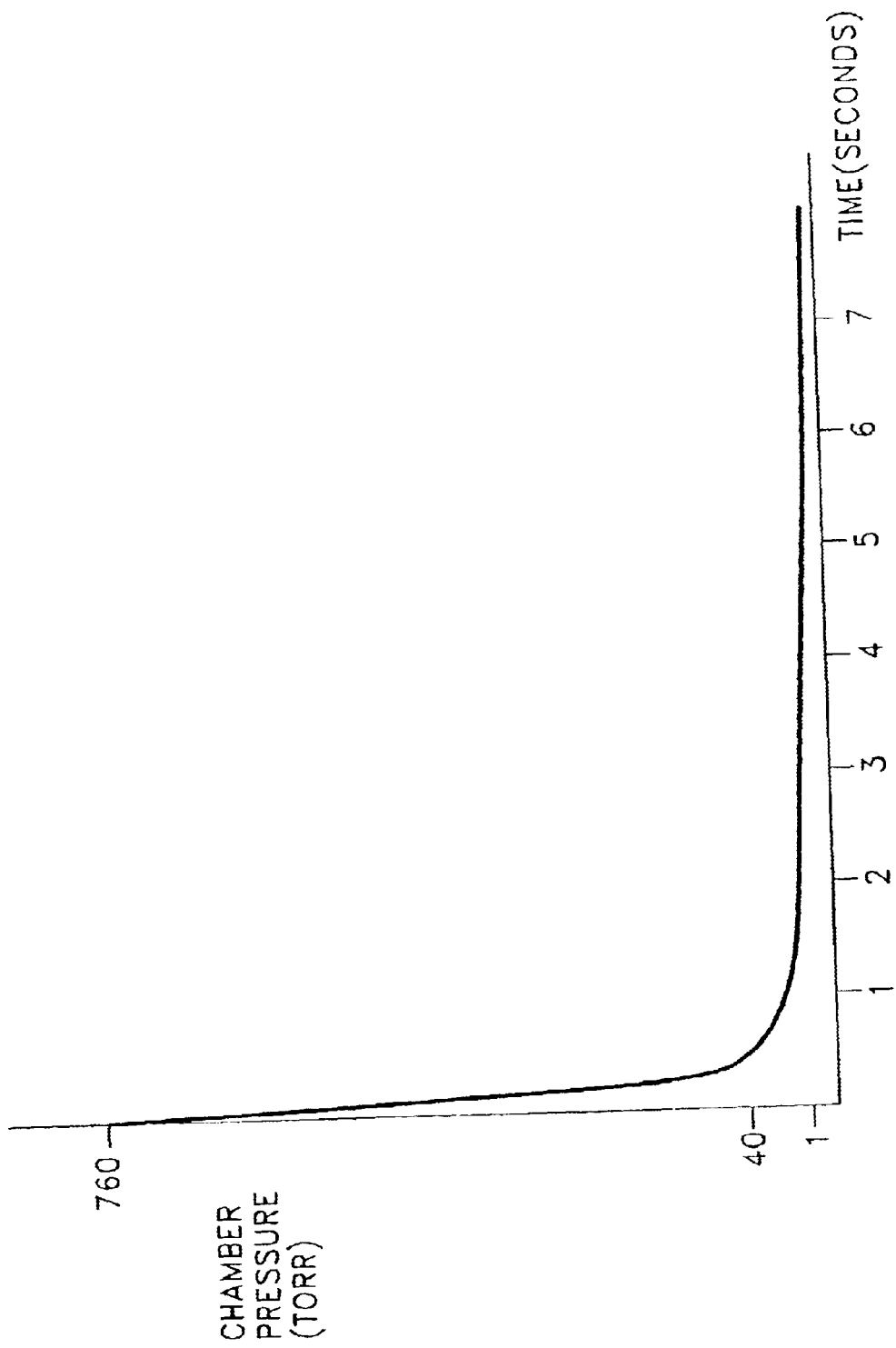
FIGS. 5A and 5B are graphs showing pressure equalization after an isolation valve is opened.
Figure 5B:
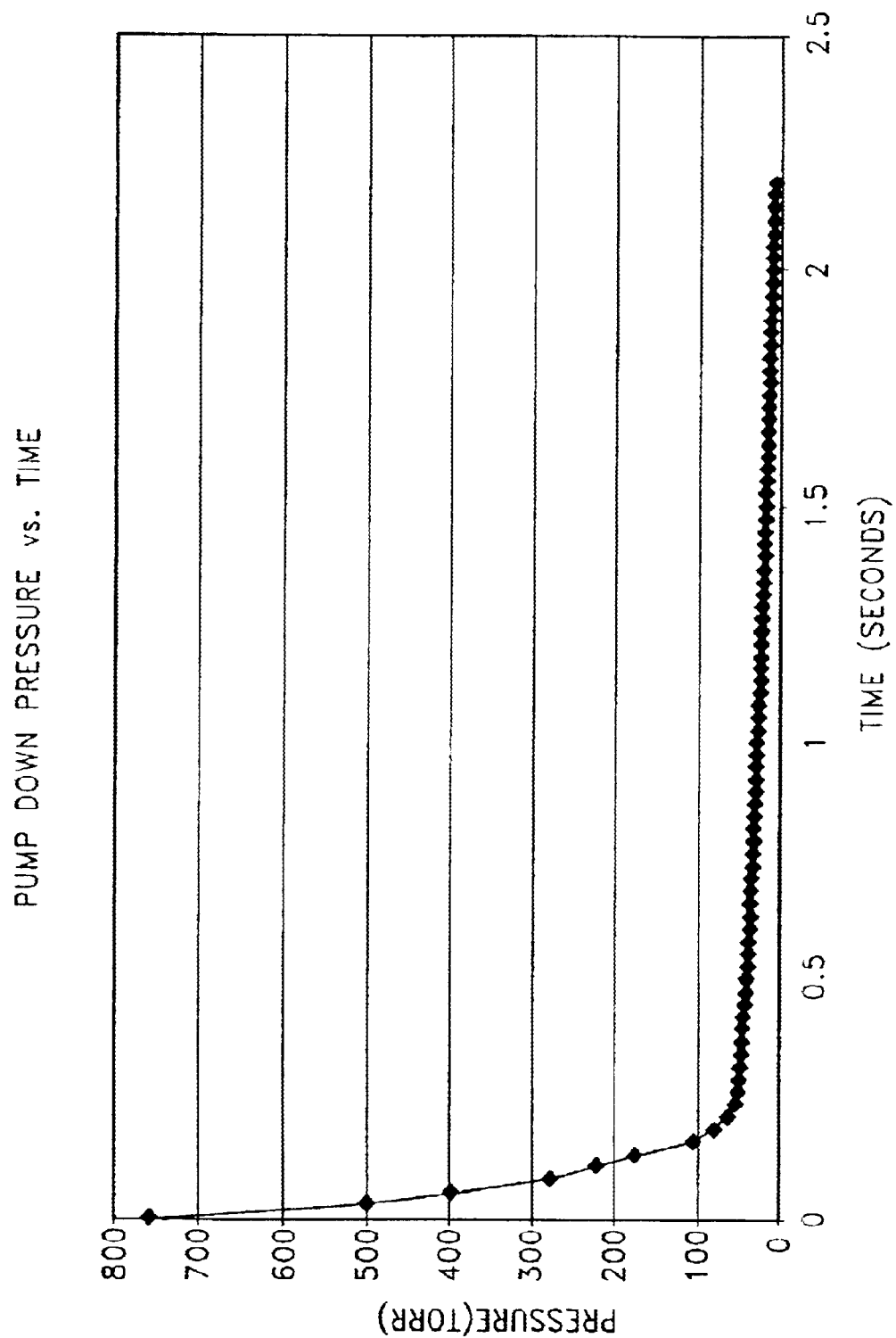

FIG. 5A is a high pump speed pump curve, illustrating the asymptotic nature of pressure reduction with the systems of FIGS. 3 and 4, while FIG. 5B shows the first few seconds of the curve in greater detail. As shown in FIG. 5A, it takes about 5 seconds to reach 1 Torr from 760 Torr. The chamber pressure drops sharply once an isolation valve is opened. This is due to pressure equalization between the chamber and the pump line. In the illustrated example, the pump line is maintained at about 40 Torr during wafer loading. When the isolation valve is opened, the chamber pressure equalizes with the larger pump line almost instantaneously. Thereafter, in the illustrated curve, the isolation valve is kept open and most of the pumping time is used to draw the vacuum from 40 Torr to the operating treatment pressure of 1 Torr The invention utilizes the heat transfer characteristic at a selected intermediate pressure (see FIG. 1) and the near instantaneous pressure equalization of the pump lines (see FIGS. 5A and 5B) to design a new process flow sequence that dramatically increases the machine throughput. It also eliminates the wafer warping concern that is usually associated with rapid wafer heating.

Standard Resist Stripping

Figure 6:
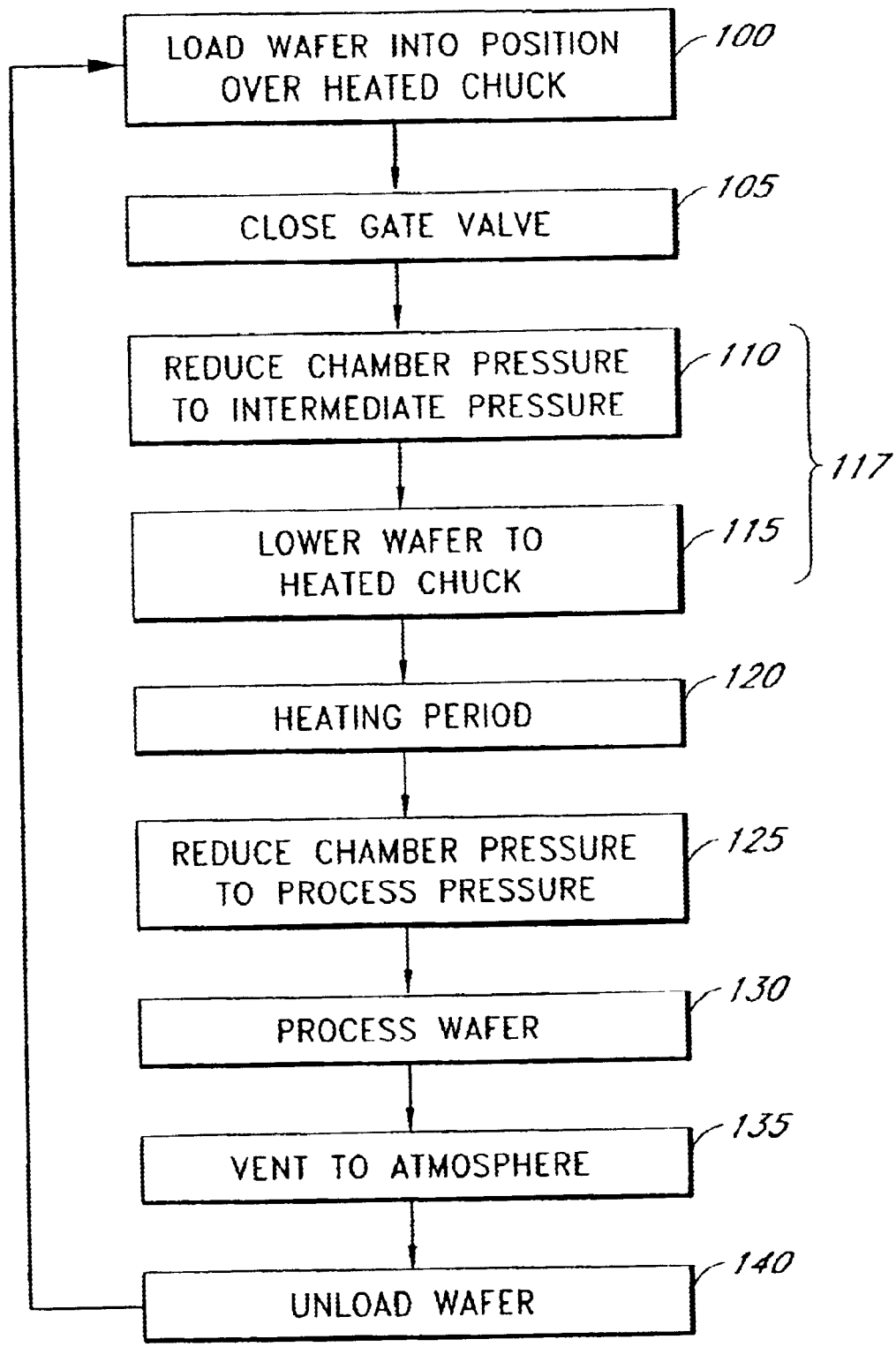
FIG. 6 is a flow chart illustrating a process sequence in accordance with preferred embodiments of the present invention.

FIG. 6 illustrates the process flow sequence of the preferred embodiments. The process will be first described with respect to the embodiment of FIG. 3, having the roughing line 30 and roughing isolation valve 32 thereon. Reference is also made to the elements within the process chamber 10, schematically shown in FIGS. 2A and 2B. As will be appreciated by the skilled artisan, the wafer transfer robot(s), gate valve, heating, gas flow and pressure control systems are desirably programmed by software or hardwire for the process flows described herein.

Initially, the wafer is loaded 100 into the upper load/ unload position proximate the wafer chuck (i.e., onto the extended lift pins 16 in the illustrated embodiment of FIG. 2A). During this time, the vacuum pump lines are maintained at or reduced to at an intermediate pressure, between the load pressure and the treatment pressure. The intermediate pressure is selected to balance the speed of thermal transfer between wafer and chuck with the speed of pump down to operating or treatment pressure. Preferably, the intermediate pressure is between about 10 Torr and 700 Torr, more preferably between about 20 Torr and 100 Torr, and is about 40 Torr in the illustrated embodiment.

Once the new wafer is transferred 100 into the chamber, the gate valve is closed 105, the chamber pressure is then reduced 110 approximately to the intermediate pressure, and the wafer is lowered 115 to the heated wafer chuck. In the illustrated embodiment, pressure reduction 110 is accomplished by opening the roughing isolation valve 32 (FIG. 3), while lowering 115 is simultaneously performed by withdrawing the pins 16 (FIG. 2B) lower the wafer to the chuck quickly. Thus, steps 110 and 115 are performed concurrently as one step 117 in the illustrated embodiment. Since the chamber pressure drops to the intermediate pressure (about 40 Torr) almost instantly, the roughing isolation valve 32 is then closed again right away to maintain the chamber at a pressure of between 40 to 80 Torr for wafer heating. The time interval between opening and closing the isolation valve determines the chamber pressure level. Experiments using the preferred vacuum pumping system 20 of FIG. 3 demonstrate that a 450-msec interval results in a pressure of around 40 Torr. Accordingly, the roughing isolation valve 32 is preferably kept open for less than 2.0 seconds, more preferably for about 0.5 second, and the wafer preferably lowers linearly during the same time period from the upper position (see FIG. 2A) to the lower position (see FIG. 2B). With the lowered pressure, thermal shock is avoided despite a rapid descent onto the heated chuck.

In the illustrated sequence, the wafer is preferably left on the chuck and allowed to heat up during a heating period 120. The heating period 120 is longer than a standard heating period at atmospheric pressure, due to the lower pressure and consequently less efficient thermal exchange, but shorter than a low pressure (1 Torr) thermal exchange. Thus, the heating period 120 is preferably greater than about 4 seconds, more preferably between about 5 seconds and 7 seconds, and is about 6 seconds in the illustrated embodiment. The lengthened heating period 120 desirably avoids thermal shock to the wafer and damage cause by wafer curling. The skilled artisan will readily appreciate that heating can alternatively be accomplished at the intermediate pressure by more slowly lowering the wafer onto the chuck, such that the wafer is at process temperature by the time it reaches the chuck. In any case, the skilled artisan will appreciate that some amount heat is also transferred at other points during the process, since the chuck is held constant at about the process temperature. Thus, heat is transferred to the wafer from the moment the wafer is loaded onto the lift pins in the elevated position.

During the heating period 120, the vacuum lines are evacuated by the vacuum pump and a large vacuum reservoir is again formed behind the isolation valves. Desirably, the pump lines are pumped to the operating pressure, which is preferably less than about 10 Torr, more preferably between 0.6 Torr and 2 Torr, and is about 1.0 Torr in the illustrated embodiment.

After wafer heating 120, the chamber pressure is reduced 125 to the operating process or treatment pressure. In the present embodiment, pressure reduction 125 is again accomplished by opening the roughing valve 32 (FIG. 3) to allow the pressure equalization. Where the vacuum line 24 is at about 1 Torr and the process chamber 10 is at about 40 Torr, opening the roughing valve 32 causes the chamber pressure to drop almost immediately to about 1.7 Torr. At this time, process or treatment gases start to flow, the throttling isolation valve 23 opens and the roughing valve 32 closes, the throttle valve 26 starts to stabilize the chamber pressure to about 1 Torr and the plasma turns on to commence wafer processing 130 (photoresist ashing or stripping, in the illustrated embodiment). All these five control actions happen almost at the same time.

Processing or treatment 130 will be understood to refer to that portion of the sequence in which the workpiece is physically or chemically altered, typically by application of process or treatment gases. In the illustrated embodiments, as noted, treatment comprises a plasma process, preferably plasma etching in the form of photoresist ashing or stripping from semiconductor wafer. The skilled artisan will readily appreciate, in view of the present disclosure, that the principles and advantages taught herein will have application to a number of low pressure treatments.

After processing or treatment 130, the chamber is vented 135 and the processed wafer is then removed or unloaded 140 from the chamber. A new wafer is inserted or loaded 100 into the chamber and the sequence starts again. During the chamber venting 135 and wafer transfer 140, 100, the vacuum line is evacuated again and a vacuum reservoir is ready for the new wafer.

Comparing the new sequence to a conventional atmospheric-to-vacuum-to-atmospheric (AVA) sequence in the same system, the pump down time is almost eliminated. The wafer heating time is desirably lengthened. In essence, the chamber pump-down and wafer heating are accomplished concurrently. An exemplary processing sequence for a conventional AVA process is as follows:

1. The robot takes 5 seconds to remove a processed wafer from the chamber and place a new wafer in the chamber.
2. It takes about 2 seconds to lower the wafer to the chuck to avoid warping the wafer. It takes about 4 seconds to heat a wafer up to 245° C.
3. It takes about 5 seconds to pump the chamber down to operating pressure and reach stabilization.
4. It takes about 15 seconds to complete the photoresist strip process,
5. It takes about 3 seconds to vent the chamber back to atmosphere.

A total of 34 seconds is required to complete a wafer. This converts to about 106 wafers per hour throughput. With the new sequence, it takes about 29 seconds to complete a wafer, translating into about 124 wafers per hour throughput, which is an increase of about 18 wafers per hour (17%) without any additional cost, apart from programming the system for the specified sequence.

The process of FIG. 6, using the concept of partial pressure heating and pressure equalization, can also be applied without the use of the dedicated roughing line (FIG. 4). This simplifies the vacuum system design and reduces the cost of the machine.

According to this embodiment, the throttle valve 26 is initially positioned at the wide-open position with the isolation valve 28 closed. The wafer is loaded 100, the gate valve closed 105, and the wafer lowered 115 to the chuck, as described above. The chamber pressure is preferably simultaneously reduced 110 by opening the isolation valve 28 and closing it immediately afterwards, as described with respect to the roughing valve of the previous embodiment. The desired intermediate or heating pressure (40 Torr in the illustrated embodiment) is thus quickly attained.

During the heating period 120, the throttle valve 26 is positioned to the preset throttling position for process condition. As in the previous embodiment, the vacuum line 24 is evacuated at the same time and a vacuum reservoir is formed.

After wafer heating 120, the chamber pressure is further reduced 125 by opening the isolation valve 28 and starting pressure equalization. Process gases start to flow and the throttle valve 26 starts to stabilize the pressure. Since the pressure is equalized through the throttle valve 26 with a preset angle, it takes about from 0.5 to 1 seconds longer to reach a treatment pressure of 1 Torr depending on the preset throttle valve angle.

After the process 130, the chamber starts to vent 135 up to atmospheric pressure and the throttle valve 26 is set to the wide-open position again. A typical throttle valve 26 takes about 3 to 5 seconds to go from the fully open position to fully closed position. By the time the new wafer is inserted into the chamber, the throttle valve 26 is fully open.

This reduced hardware setup adds about 1 second to the previous sequence in the worst case. With the same process time of 15 seconds, the machine throughput is 120 wafers per hour.

Implanted Resist Stripping

As will be appreciated by the skilled artisan, some mask steps in semiconductor processing are utilized for implanting dopants into semiconductor material. These implanted masks are particularly difficult to remove. In particular, as the wafer is heated, solvent in the photoresist is volatilized but cannot escape due to the hardened crust left on the resist surface by the implantation. The gases build up as the wafer is heated and can explode, leaving a residue on the chamber walls that is very difficult to remove.

Accordingly, it is advantageous to remove the crust of the resist at a lower temperature (e.g., 100° C. to 120° C.), then raise the temperature to improve throughput for the remainder of the stripping process. Unfortunately, raising and lowering the chuck temperature, while feasible in a radiantly heated system, reduces throughput tremendously with convective/conductive or resistively heated chucks.

Figure 7:
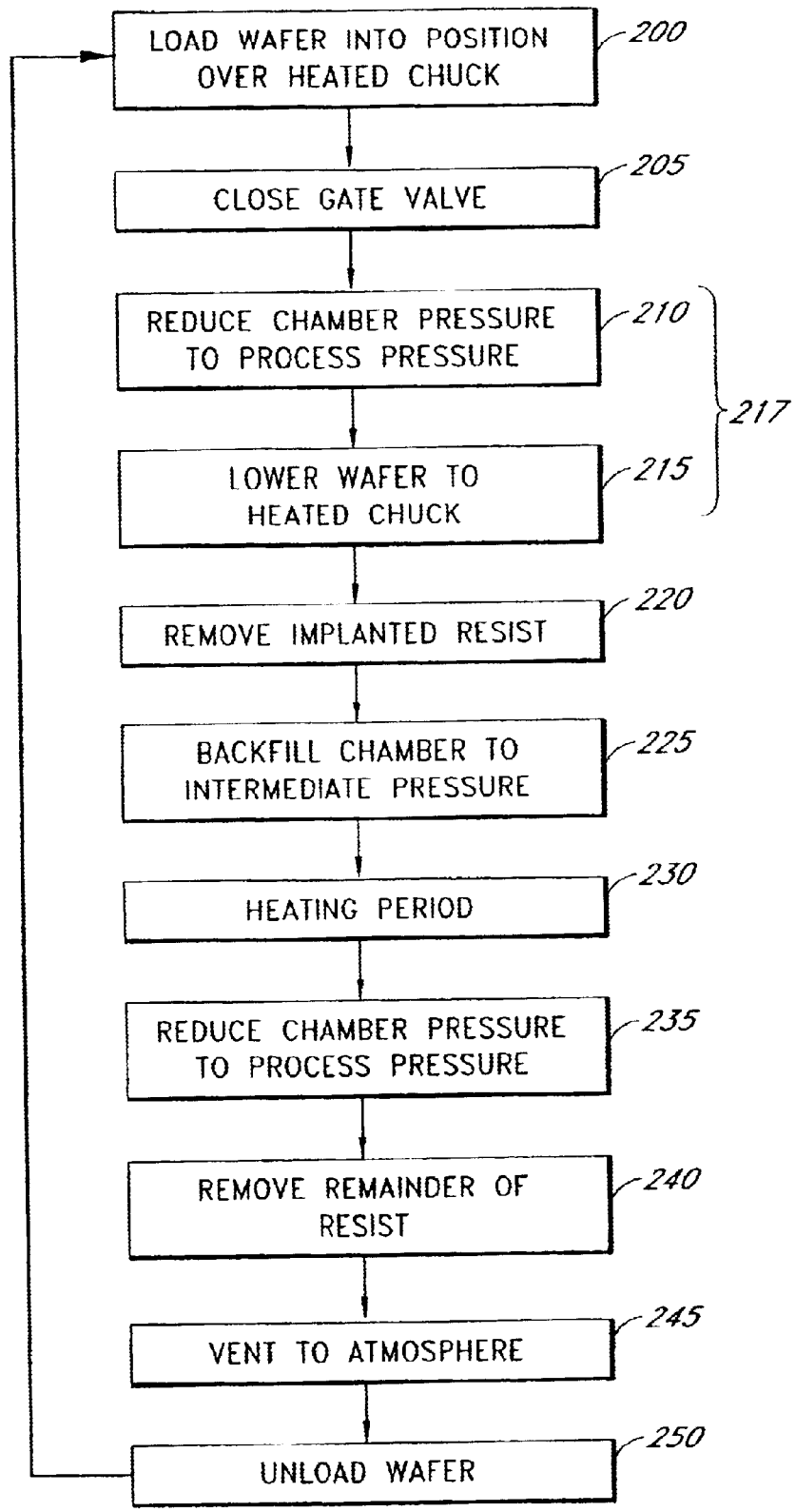
FIG. 7 is a flow chart illustrating a process sequence of another embodiment of the invention, particularly for removing implanted photoresist.

Referring to FIG. 7, a process for removing implanted resist is shown in accordance with a preferred embodiment of the invention. As with the previous embodiment, the wafer is loaded/unloaded at atmospheric pressure, and processing is conducted at low pressure (preferably less than about 10 Torr, more preferably less than about 5 Torr; in the illustrated embodiment, preferably between about 0.6 Torr and 2 Torr, and more preferably at about 1.0 Torr). Also similar to the previous embodiment, some heating is conducted at an intermediate pressure, between about 10 Torr and 700 Torr, more preferably between about 20 Torr and 100 Torr, and about 40 Torr in the illustrated embodiment. Furthermore, the chuck is maintained at about the process temperature (which is preferably greater than about 150° C., more preferably between about 200° C. and 300° C., and most preferably between about 225° C. and 250° C.) throughout the process described.

Unlike the previous embodiment, heating at the intermediate pressure is conducted after partial processing.

The process can be conducted with respect to either the embodiment of FIGS. 3 or the embodiment of FIG. 4, that is, with or without the roughing line and roughing isolation valve thereon. The skilled artisan will appreciate that the wafer transfer robot(s), gate valve, heating, gas flow and pressure control systems are desirably programmed by software or hardwire for the process flows described herein.

Initially, the wafer is loaded 200 into the upper load/unload position proximate the wafer chuck (e.g., onto the extended lift pins 16 in the illustrated embodiment of FIG. 2A). During this time, the vacuum pump lines are reduced as much as possible to an intermediate pressure, between the load pressure and the treatment pressure. Preferably, the intermediate pressure is between about 10 Torr and 700 Torr, more preferably between about 20 Torr and 100 Torr, and is about 40 Torr in the illustrated embodiment.

Once the new wafer is transferred 200 into the chamber, the gate valve is closed 205, the chamber pressure is then reduced 210 approximately to the treatment pressure, and the wafer is lowered 215 to the heated wafer chuck. In the illustrated embodiment, pressure reduction 210 is accomplished by opening an isolation valve (FIGS. 3 or 4), while lowering 215 is simultaneously performed by withdrawing the pins lower the wafer to the chuck quickly. Thus, steps 210 and 215 are performed concurrently as one step 217 in the illustrated embodiment. The chamber pressure drops to the pressure of the pump lines almost instantly, but the isolation valve remains open and pumping continues until the treatment pressure is reached (preferably less than about 10 Torr, more preferably less than about 5 Torr; in the illustrated plasma ashing context embodiment, preferably between about 0.6 Torr and 2 Torr, and more preferably at about 1.0 Torr). The wafer preferably lowers linearly during the same time period from the upper or elevated position to the lower position (see FIGS. 2A and 2B). With the low pressure, heat transfer is slow. Accordingly, the wafer tends to reach only between about 100° C. and 170° C. through the subsequent process step.

Thereafter, a stripping process 220 is conducted for removing the implanted crust of the resist at the low temperature. In addition to a conventional plasma asher chemistry including oxidant gases (e.g., 5 slm $O_2$ through the remote plasma unit, carrier gas), hydrogen and/or fluorine is added. For example, 1,000 sccm of 3–15% $H_2$ (in $N_2$ or He) and/or $CF_4$ (1–3% of total flow) can be added to the flow through the preferred remote plasma generator. In about 20–30 seconds, the crust is removed and the plasma flow is stopped.

After the crust is removed, the chamber pressure is elevated 225 to the intermediate pressure between about 10 Torr and 700 Torr, more preferably between about 20 Torr and 100 Torr, facilitating more rapid heat transfer between the heated chuck and the wafer. In the illustrated embodiment, the pressure is increased to 40 Torr, most preferably by flowing a high thermal conductivity gas and closing the isolation valve, thereby backfilling the chamber. Ideally, helium is utilized to facilitate more effective thermal exchange. The pressure elevation can be conducted at once or stepwise in incremental changes.

After a period sufficient to raise the wafer to the preferred process temperature (about 245° C. in the illustrated embodiment), the chamber pressure is again reduced 235 to a treatment pressure, preferably the same pressure as that of the implanted resist removal phase. The stripping 240 of standard (non-implanted) resist can then proceed more rapidly at the elevated temperature. $CF_4$, if previously supplied, is stopped during the standard strip, although any $H_2$ can flow during standard resist stripping without any harm.

After removing 240 the remainder of the resist, the chamber is vented 245 and the processed wafer is then removed or unloaded 250 from the chamber. A new wafer is inserted or loaded 200 into the chamber and the sequence starts again. During the chamber venting 245 and wafer transfer 250, 200, the vacuum line is evacuated again and a vacuum reservoir is ready for the new wafer.

Conclusion

We have run the new sequence and compared the process results with the conventional sequence. Both results are nearly identical. In the conventional sequence, the rate of wafer descent onto the chuck is critical. If the rate of descent is too fast, wafers may warp. The new sequence improves confidence because wafer warping may be eliminated as a concern due to the slower rate of heating at 40 Torr. Using the vacuum reservoir and pressure equalization concept, the extensive multitasking control sequence increases machine throughput significantly for much improved productivity.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

We claim:

1. A system for treating a semiconductor substrate, the system comprising:
   a heatable chuck for supporting the substrate within a process chamber;
   a substrate transfer system configured to move the substrate between a load/unload position supporting the substrate elevated above the chuck and a treatment position supporting the substrate upon the chuck;
   a vacuum pump connected to the process chamber; and
   a control system programmed, in sequence, to
      maintain the chuck at a treatment temperature,
      introduce a substrate into the process chamber at the load/unload position while the chamber is at a load/unload pressure,
      change chamber pressure to an intermediate pressure between the load/unload pressure and a treatment pressure,
      heat the substrate at the intermediate pressure in the treatment position,
      reduce chamber pressure to the treatment pressure, and
      introduce treatment gases for treating the substrate at the treatment pressure.

2. The system of claim 1, wherein the control system is additionally programmed to reduce chamber pressure to a preliminary treatment pressure while lowering the substrate to the treatment position and subsequently conducting the step of changing chamber pressure, wherein the step of changing chamber pressure comprises raising chamber pressure from the preliminary treatment pressure to the intermediate pressure.

3. The system of claim 2, wherein the control system is additionally programmed to introduce treatment gases suitable for removing dopant implanted photoresist at the preliminary treatment pressure.

4. The system of claim 3, wherein introducing treatment gases at the treatment pressure comprises introducing treatment gases suitable for removing unimplanted photoresist.

5. The system of claim 1, wherein introducing treatment gases at the treatment pressure comprises introducing an oxidant gas suitable for removing photoresist.

6. The system of claim 1, wherein the treatment pressure is less than about 10 Torr and the load/unload pressure is about atmospheric.

7. The system of claim 6, wherein the intermediate pressure is between about 10 Torr and 100 Torr.

8. A system for treating a semiconductor substrate, the system comprising: a heatable chuck for supporting the substrate within a process chamber;
   a substrate transfer system configured to move the substrate between a load/unload position supporting the substrate elevated above the chuck and a treatment position supporting the substrate upon the chuck;
   a vacuum pump connected to the process chamber; and
   a control system programmed, in sequence, to
      maintain the chuck at a treatment temperature,
      introduce a substrate into the process chamber at the load unload position while the chamber is at a load unload pressure,
      change chamber pressure to an intermediate pressure between the load unload pressure and a treatment pressure,
      heat the substrate at the intermediate pressure in the treatment position, reduce chamber pressure to the treatment pressure, introduce treatment gases for treating the substrate at the treatment pressure; and lower the substrate to the treatment position at the intermediate pressure while simultaneously heating the substrate.

9. A system for treating a semiconductor substrate, the system comprising:

a temperature controlled chuck for supporting the substrate within a process chamber;

a substrate transfer system configured to move the substrate between a load unload position supporting the substrate elevated above the chuck and a treatment position supporting the substrate upon the chuck;

a vacuum pump connected to the process chamber; and a control system programmed to:

load/unload substrates at a load/unload pressure;

process a substrate supported on the chuck at a reduced pressure; and conduct thermal exchange steps, wherein heat flows between the chuck and a substrate supported thereon, at an intermediate pressure between the reduced pressure and the load/unload pressure.

10. The system of claim 9, wherein the control system is programmed to reduce chamber pressure from the load unload pressure to the intermediate pressure for one thermal exchange step.

11. The system of claim 9, wherein the control system is programmed to increase chamber pressure from the reduced pressure to the intermediate pressure for one thermal exchange step.

12. The system of claim 11, wherein the control system is additionally programmed to introduce treatment gases suitable for removing dopant implanted photoresist at the reduced pressure.

13. The system of claim 12, wherein introducing treatment gases at the reduced pressure comprises introducing treatment gases suitable for removing unimplanted photoresist.

14. The system of claim 9, wherein processing the substrate at the reduced pressure comprises introducing an oxidant gas suitable for removing photoresist.

15. The system of claim 9, wherein the reduced pressure is less than about 10 Torr and the load/unload pressure is about atmospheric.

16. The system of claim 15, wherein the intermediate pressure is between about 10 Torr and 100 Torr.

17. A system for treating a semiconductor substrate, the system comprising:

a temperature controlled chuck for supporting the substrate within a process chamber;

a substrate transfer system configured to move the substrate between a load/unload position supporting the substrate elevated above the chuck and a treatment position supporting the substrate upon the chuck;

a vacuum pump connected to the process chamber; and a control system programmed to:

load/unload substrates at a load/unload pressure;

process a substrate supported on the chuck at a reduced pressure;

lower the substrate to the treatment position at the intermediate pressure while simultaneously heating the substrate; and conduct thermal exchange steps, whereby heat flows between the chuck and a substrate supported thereon, at an intermediate pressure between the reduced pressure and the load/unload pressure.

18. The system of claim 17, wherein the control system is programmed to reduce chamber pressure while the substrate transfer systems lowers the substrate to the treatment position.

* * * * *